(12) United States Patent
Nomura

(10) Patent No.: US 6,822,435 B2
(45) Date of Patent: Nov. 23, 2004

(54) COMPARATOR CIRCUIT FOR DIFFERENTIAL SWING COMPARISON AND COMMON-MODE VOLTAGE COMPARISON

(75) Inventor: Toshihiro Nomura, Yokohama (JP)

(73) Assignee: NPTest Inc., San Jose, CA (US)

( * ) Notice: Subject to any disclaimer, the term of this patent is extended or adjusted under 35 U.S.C. 154(b) by 417 days.

(21) Appl. No.: 10/057,134

(22) Filed: Jan. 24, 2002

(65) Prior Publication Data

US 2003/0137289 A1 Jul. 24, 2003

(51) Int. Cl.[7] .................. G01R 3/126; G01R 3/128; H03K 5/22; H03K 51/53
(52) U.S. Cl. ............... 324/158.1; 324/765; 714/734; 714/735; 327/63; 327/82
(58) Field of Search .............................. 324/158.1, 763, 324/765; 702/108, 117, 118; 714/718, 724, 734, 735, 738; 327/50–52, 56, 63, 65, 68, 74, 77, 82; 330/252

(56) References Cited

U.S. PATENT DOCUMENTS 6,281,699 B1 * 8/2001 Bishop ....................... 324/765
6,300,804 B1 * 10/2001 Vadipour ..................... 327/63
6,323,694 B1 * 11/2001 Creek ........................... 327/69
6,392,448 B1 * 5/2002 Vadipour ..................... 327/51

* cited by examiner

Primary Examiner—Kamand Cuneo
Assistant Examiner—Russell M. Kobert

(57) ABSTRACT

A comparator circuit includes at least one transconductance stage that receives two test voltages and two reference voltages. The transconductance stage produces two test currents that are proportional to the test voltages and two reference currents. A switching circuit is coupled to the transconductance stage. The switching circuit has two output terminals that are coupled to a conventional comparator stage. The switching circuit can combine the test currents with the reference currents to realize a differential swing comparison mode and a common-mode comparison mode as required for testing differential signals. Moreover, by disabling appropriate output signals from the at least one transconductance stage, a single-ended comparison mode is realized. By using two identical transconductance amplifiers, the non-linearity of the transconductance stage is advantageously canceled out.

17 Claims, 11 Drawing Sheets

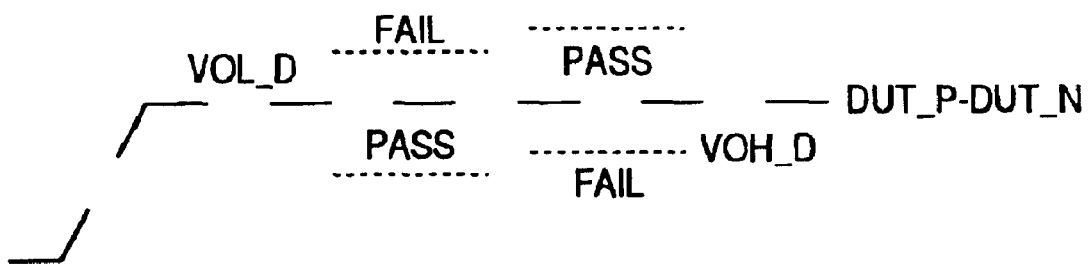
Figure 3C(ii)

COMPARATOR CIRCUIT FOR DIFFERENTIAL SWING COMPARISON AND COMMON-MODE VOLTAGE COMPARISON

FIELD OF THE INVENTION

This invention relates to an integrated comparator circuit widely used for pin electronics in automatic test equipment (ATE).

BACKGROUND

In a semiconductor test system, pin electronics provide an interface to the device under test (DUT). The pin electronics interface is generally realized with an application specific integrated circuit (ASIC) in order to reduce the size of the pin electronics. Size reduction is necessary for achieving a high pin-count test system (such as over 1000 pins). The ASIC pin electronics also eliminate multiple reflections by eliminating the circuit board stubs that are inevitably present in discrete implementations. Signal integrity improvement and size reduction realized by ASIC implementation are essential for high-speed (over 1 GHz) test systems.

Recently, there has been an increased demand for accurate testing of high-speed differential signals. Many state-of-the-art high-speed devices now realize higher data rates by using differential signaling to improve signal integrity and timing accuracy. However, conventional pin electronics are designed for testing single-ended signals, not for testing differential signals.

FIG. 1 illustrates one configuration used to test DUT pins 34a and 34b using two conventional single-ended pin electronics 36 and 38. Pin electronics interface 36 generally consists of driver 36a and a window comparator consisting of high comparator circuit 36b and low comparator circuit 36c. Similarly, pin electronics interface 38 includes driver 38a and a window comparator consisting of high comparator circuit 38b and low comparator circuit 38c. Thus, conventional pin electronics interface 36 is single-ended for DUT pin 34a, while pin electronics interface 38 is single-ended for DUT pin 34b. Using pin electronics interface 36 as an example, the driver circuit 36a sends formatted signals to DUT pin 34a. High comparator circuit 36b and low comparator circuit 36c receive signals from DUT pin 34a and compare the received signals with reference voltages. The input stages of high comparator circuit 36b and low comparator circuit 36c are realized by an identical circuit. Only the output logic from high comparator circuit 36b and low comparator circuit 36c is different.

FIG. 2 shows a conventional single-ended comparator circuit 10, such as high comparator circuit 36b or low comparator circuit 36c of FIG. 1. Conventional comparator circuit 10 compares the DUT signal that is applied to the base 12 of transistor 14 with a reference voltage applied to the base 16 of second transistor 18. Comparator circuit 10 consists of emitter follower stages (transistor 14/transistor 18), switch stages (transistor 20/transistor 22), cascode stages (transistor 24/transistor 26) and an additional gain stage 28. The emitter follower stages (transistor 14/transistor 18) eliminate the level error caused by the base current of the switch stages (transistor 20/transistor 22). The cascode stages (transistor 24/transistor 26) reduce crosstalk from DUT signal 12 to the input of additional gain stage 28. Schottky diodes 30, 31, 32, and 33 protect the switch stage (transistor 20/transistor 22) against reverse breakdown.

Unfortunately, when using conventional comparator circuit 10 of FIG. 2 in the pin electronics configuration shown in FIG. 1, not all test modes required for differential signaling can be provided. Only P-channel comparison and N-channel comparison can be realized with conventional comparator circuit 10. Conventional comparator circuit 10 cannot realize differential comparison mode or common-mode comparison mode.

FIGS. 3A, 3B, 3C(i), 3C(ii), and 3(D) summarize the comparator test modes required for differential signaling. FIG. 3A is the P-channel comparison mode, where the P-channel of the DUT input (DUT_P) is compared with a high P-channel reference voltage (VOH_P) and a low P-channel reference voltage (VOL_P). As shown in FIG. 3A, the DUT_P input will fail if it is higher than the VOL_P or lower than the VOH_P, but will pass if it is lower than the VOL_P or higher than the VOH_P.

FIG. 3B is the N-channel comparison mode, where the N-channel of the DUT input (DUT_N) is compared with a high N-channel reference voltage (VOH_N) and a low N-channel reference voltage (VOL_N). The DUT_N input will pass if it is higher than VOH_N or lower than VOL_N, but will fail if lower than VOH_N or higher than VOL_N.

FIG. 3C(i) is the differential swing comparison mode, where the swing of the DUT signal (DUT_P−DUT_N), as shown in FIG. 3C(ii), is compared with a high differential reference voltage (VOH_D) and a low differential reference voltage (VOL_D). The swing of the DUT signal (DUT_P−DUT_N) will fail if it is higher than VOL_D or lower than VOH_D, but will pass if it is lower than VOL_D or higher than VOH_D.

FIG. 3D is the common-mode voltage comparison mode, where the common-mode voltage of the DUT swing (DUT_P+DUT_N)/2 is compared with a high common-mode reference voltage (VOH_C) and a low common-mode reference voltage (VOL_C). The common-mode voltage of the DUT signal (DUT_P+DUT_N)/2 will fail if it is higher than VOL_C or lower than VOH_C, but will pass if it is lower than VOL_C or higher than VOH_C.

Again, using conventional comparator circuit 10 of FIG. 2 in the pin electronics configuration of FIG. 1 will only realize the P-channel and the N-channel comparison modes. Conventional comparator circuit 10 cannot realize the differential swing comparison mode or the common-mode comparison mode.

FIG. 4 shows a conventional configuration used to realize the differential swing comparison mode (FIG. 3C(i) and 3C(ii)) that could not be realized by comparator circuit 10 of FIG. 2. In differential comparator circuit 40, a differential comparator stage 41 is added prior to conventional comparator circuit 10'. Differential comparator stage 41 has DUT_P 12a and DUT_N 12b applied through an emitter follower stage (transistor 42/transistor 44), a differential gain stage (transistor 46/transistor 48), and a cascode stage (transistor 50/transistor 52). The output of differential comparator stage 41 is coupled to a conventional comparator circuit 10'. The differential swing between the collectors of transistor 50 and transistor 52 is approximately given by:

$$\frac{(R1)}{(R2)} \cdot (\text{DUT\_P} - \text{DUT\_N}), \qquad \text{eq. 1}$$

where R1 is resistor 53 and R2 is resistor 54. The voltage at the collector of transistor 52 is buffered by transistor 14, with optional level shift circuit 56 available if necessary to avoid saturation of transistor 20. Then, the buffered and shifted output voltage from transistor 52 is compared with a reference voltage 16 that is applied to the base of transistor 18.

One of the disadvantages of comparator circuit 40, however, is that as the input swing becomes larger, the differential gain stage (transistor 46/transistor 48) becomes nonlinear because of the change in the transconductance of transistor 46 and transistor 48. The non-linearity in turn degrades the DC accuracy of the test system. In addition, level shift circuit 56 adds offset level drift, degrades the waveform, and limits the maximum speed at which differential comparator circuit 40 can operate. Moreover, common-mode voltage comparison, as shown in FIG. 3D, cannot be realized by the differential comparator circuit 40 of FIG. 4. Consequently, conventional differential comparator circuit 40 of FIG. 4 is inadequate for accurate testing of a DUT with high-speed differential signals.

SUMMARY

An embodiment of the present invention provides a comparator circuit that enables P-channel comparison, N-channel comparison, differential swing comparison, and common-mode voltage comparison required for testing differential signals as shown in FIGS. 3A–3D. The differential swing comparison compares the swing of the differential input (DUT_P–DUT_N) with reference voltages. The common-mode voltage comparison compares the common-mode voltage of the input (DUT_P+DUT_N)/2 with reference voltages. According to another embodiment of the present invention, the comparator circuit has a control input to select one of the P-channel, N-channel, differential, or common-mode voltage comparison modes.

By using two identical transconductance amplifiers, the non-linearity of the transconductance stage is advantageously canceled out. Furthermore, by summing the currents of the transconductance amplifiers directly instead of first converting them to voltages, high-speed comparator operation can be achieved. Thus, by diverting currents from the transconductance amplifiers in various ways, eight different comparison modes can be realized according to one embodiment of the present invention.

A comparator circuit in accordance with one embodiment of the present invention includes at least one stage that has a first input terminal that receives a first test voltage, a second input terminal that receives a first reference voltage, a third input terminal that receives a second test voltage, and a fourth input terminal that receives a second reference voltage. In one embodiment, the at least one stage is a transconductance stage. In another embodiment, there are two separate transconductance stages, where the first and second input terminals are on one transconductance stage and the third and fourth input terminals are on the other transconductance stage. The at least one stage converts the voltages to signals and produces a first test signal on a first output terminal, a first reference signal on a second output terminal, a second test signal on a third output terminal, and a second reference signal on a fourth output terminal. The signals may be currents or voltages. The comparator circuit includes a switching circuit that is coupled to the output terminals of the at least one stage. The switching circuit has two output terminals. The switching circuit switchably couples its first output terminal to the first output terminal and one of the third output terminal and the fourth output terminal of the at least one transconductance stage. The switching circuit also switchably couples its second output terminal with the first output terminal and one of said third output terminal and said fourth output terminal of said at least one stage. In addition, a comparator circuit is included that is coupled to the output terminals of the switching circuit. In one embodiment, the switching circuit also includes transistors that couple selected output terminals of the at least one transconductance stage to a voltage source to realize a single-ended signals.

In another embodiment of the present invention, a method of testing a circuit includes providing a first test voltage from a first channel and a second test voltage from a second channel from said circuit. A first reference voltage and a second reference voltage are also provided. The test voltages and the reference voltages are converted to test signals and reference signals, that may be either voltages or currents. The method includes switchably combining said first test signal with one of said second reference signal and said second test signal to form a first combined signal and switchably combining said first reference signal with one of said second test signal and said second reference signal to form a second combined signal. The first combined signal and the second combined signal are then compared. By selecting the appropriate combinations, the method realizes a differential swing comparison mode and a common-mode comparison mode. Also, by disabling the appropriate test current and reference current, a single-ended comparison mode, e.g., for the P-channel or the N-channel, may be realized.

BRIEF DESCRIPTION OF THE DRAWINGS

FIG. 3C(ii) shows a schematic view of another embodiment of a differential swing comparison mode.

DETAILED DESCRIPTION

Figure 5A:
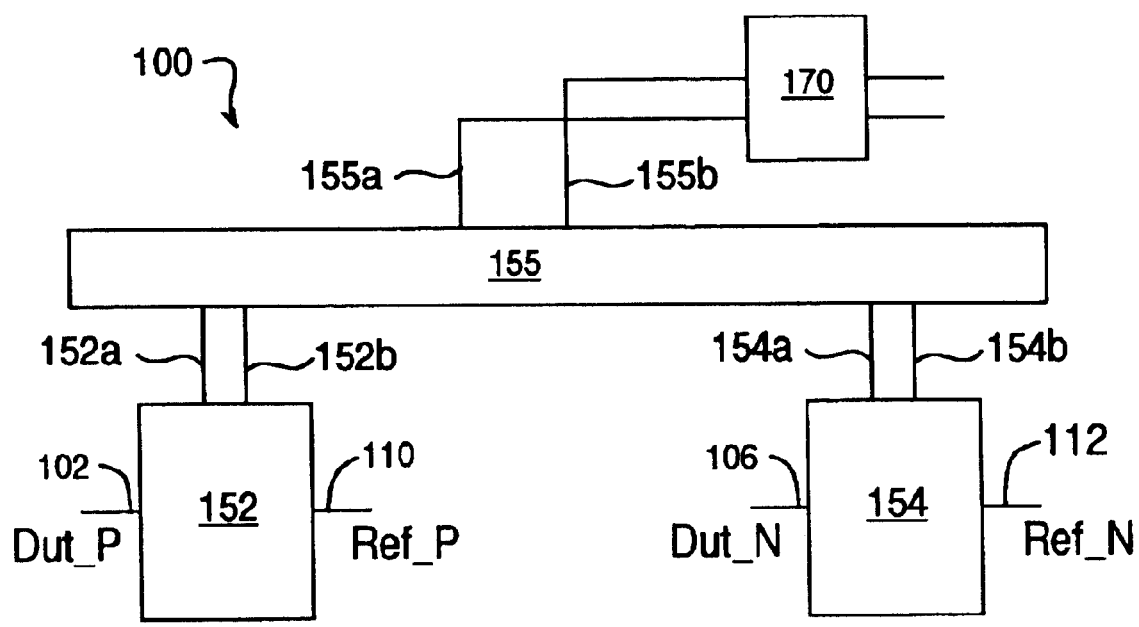
FIG. 5A shows a block diagram of a comparator circuit having differential swing comparison mode and common-mode voltage comparison mode in accordance with an embodiment of the present invention.

FIG. 5A shows a block diagram of comparator circuit 100 having differential swing comparison mode and common-mode voltage comparison mode in accordance with an embodiment of the present invention.

As shown in FIG. 5A, differential signal DUT_P is applied to an input terminal 102 of transconductance stage 152 for the positive channel, and differential signal DUT_N is applied to an input terminal 106 of transconductance stage 154 for the negative channel. Reference voltage Ref_P is applied to terminal 110, and reference voltage Ref_N is applied to terminal 112. The reference inputs Ref_P and Ref_N are programmable voltages and have the same input range as DUT_P and DUT_N. Transconductance stage 152 includes two output terminals 152a, 152b upon which is produced a current signal proportional to DUT_P and Ref_P, while transconductance stage 154 includes two output terminals 154a, 154b upon which is produced a current signal proportional to DUT_N and Ref_N. For the sake of simplicity, the signals produced by transconductance stages 152 and 154 will be referred to as DUT_P, Re_P, and DUT_N, Ref_N, respectively. The output terminals 152a, 152b and 154a, 154b are received by a switch stage 155.

As will be discussed in more detail below, it should be understood that the signals produced by stages 152 and 154 can be current signals or voltage signals.

Figure 1:
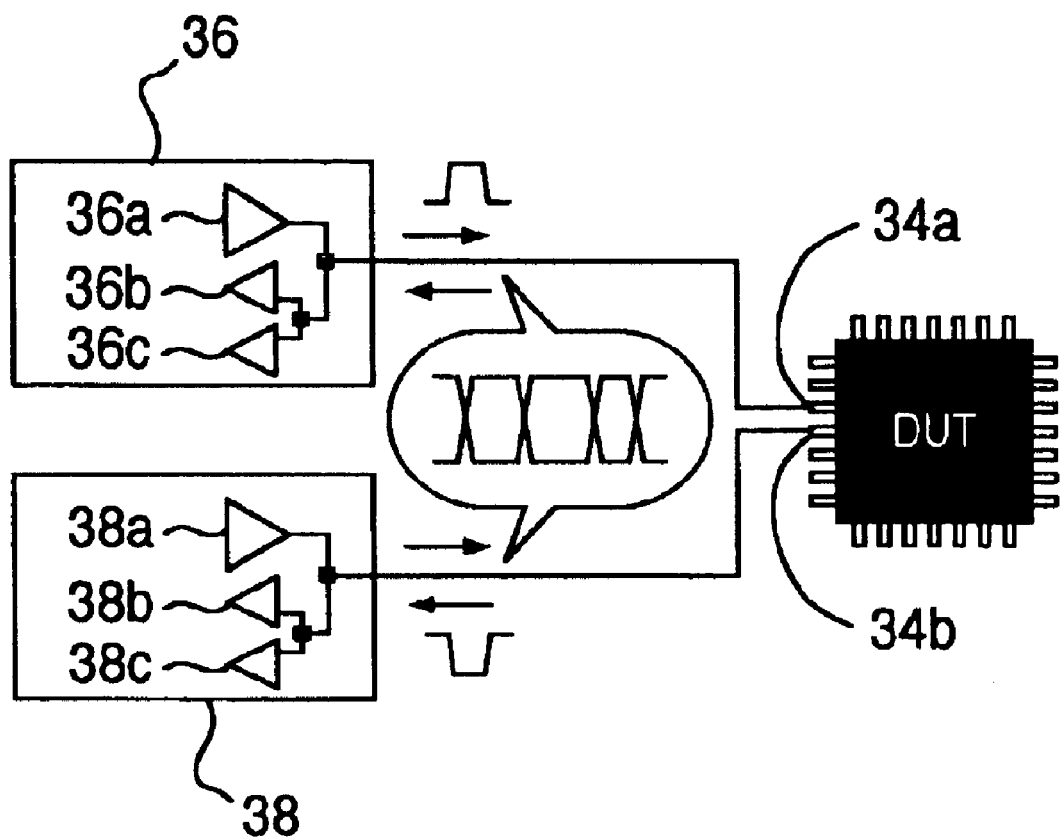
FIG. 1 shows a schematic diagram of a conventional comparator circuit.
Figure 2:
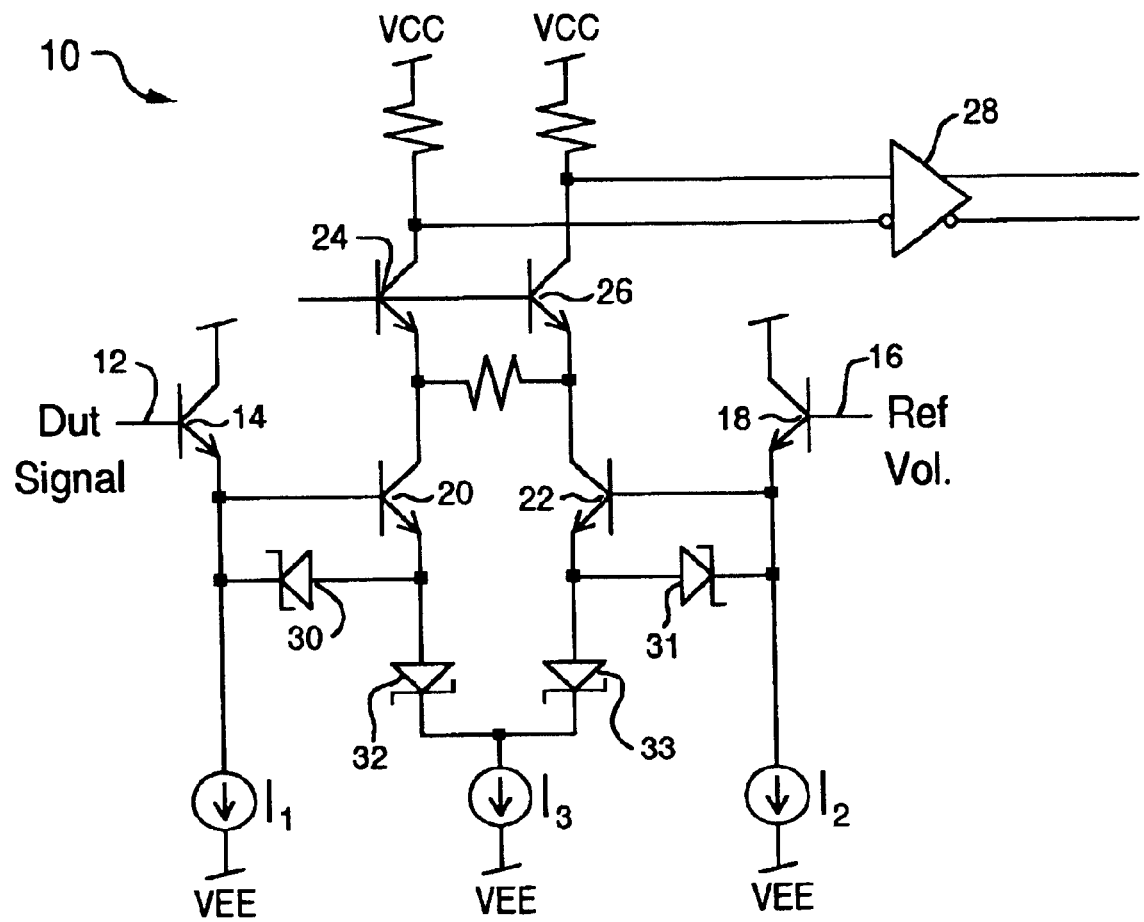
FIG. 2 shows a schematic view of a conventional configuration that tests two DUT pins using two conventional single-ended pin electronics.
Figure 3A:
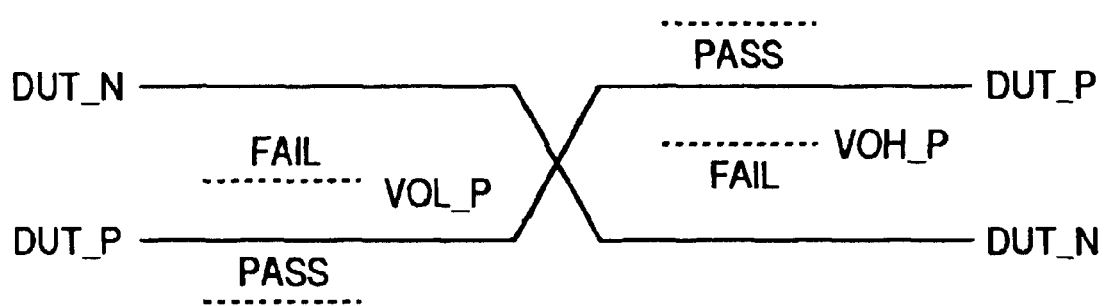
FIG. 3A shows a schematic view of a P-channel comparison mode.
Figure 3B:
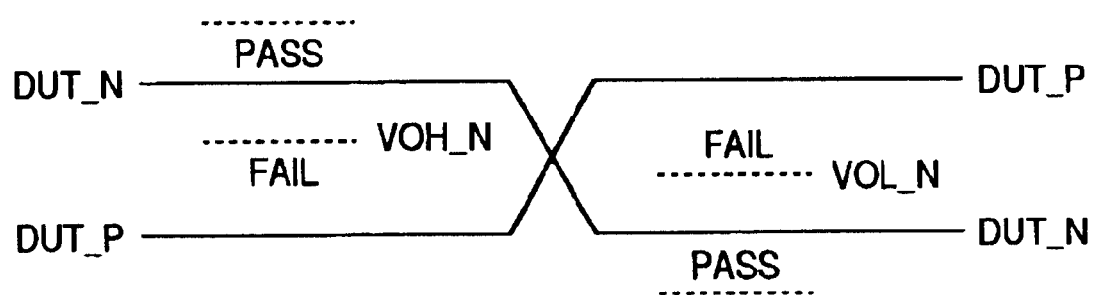
FIG. 3B shows a schematic view of an N-channel comparison mode.
Figure 3C:
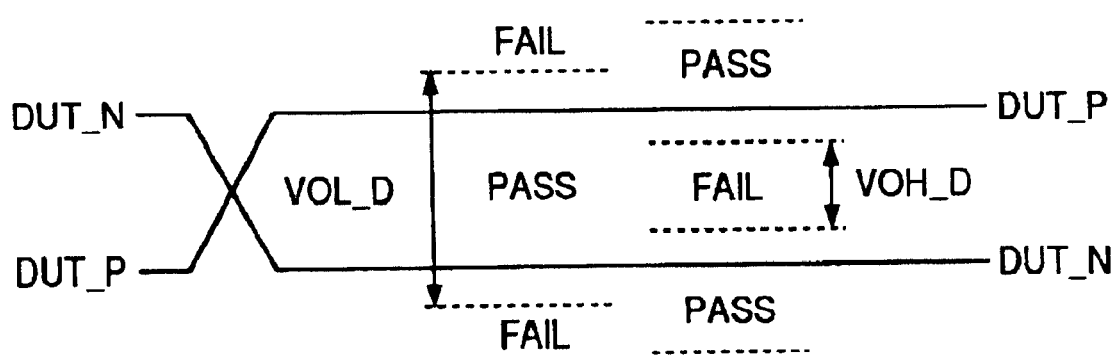
FIG. 3C(i) shows a schematic view of one embodiment of a differential swing comparison mode.
Figure 3D:
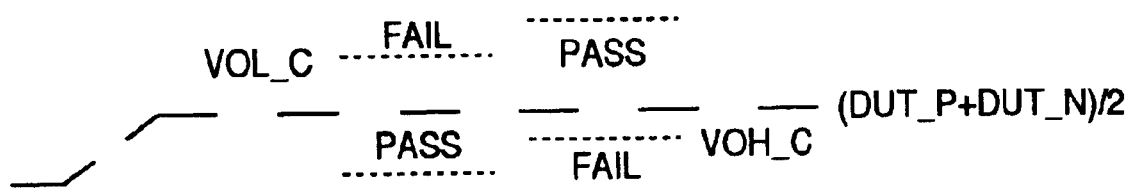
FIG. 3D shows a schematic view of a common-mode voltage comparison mode.
Figure 4:
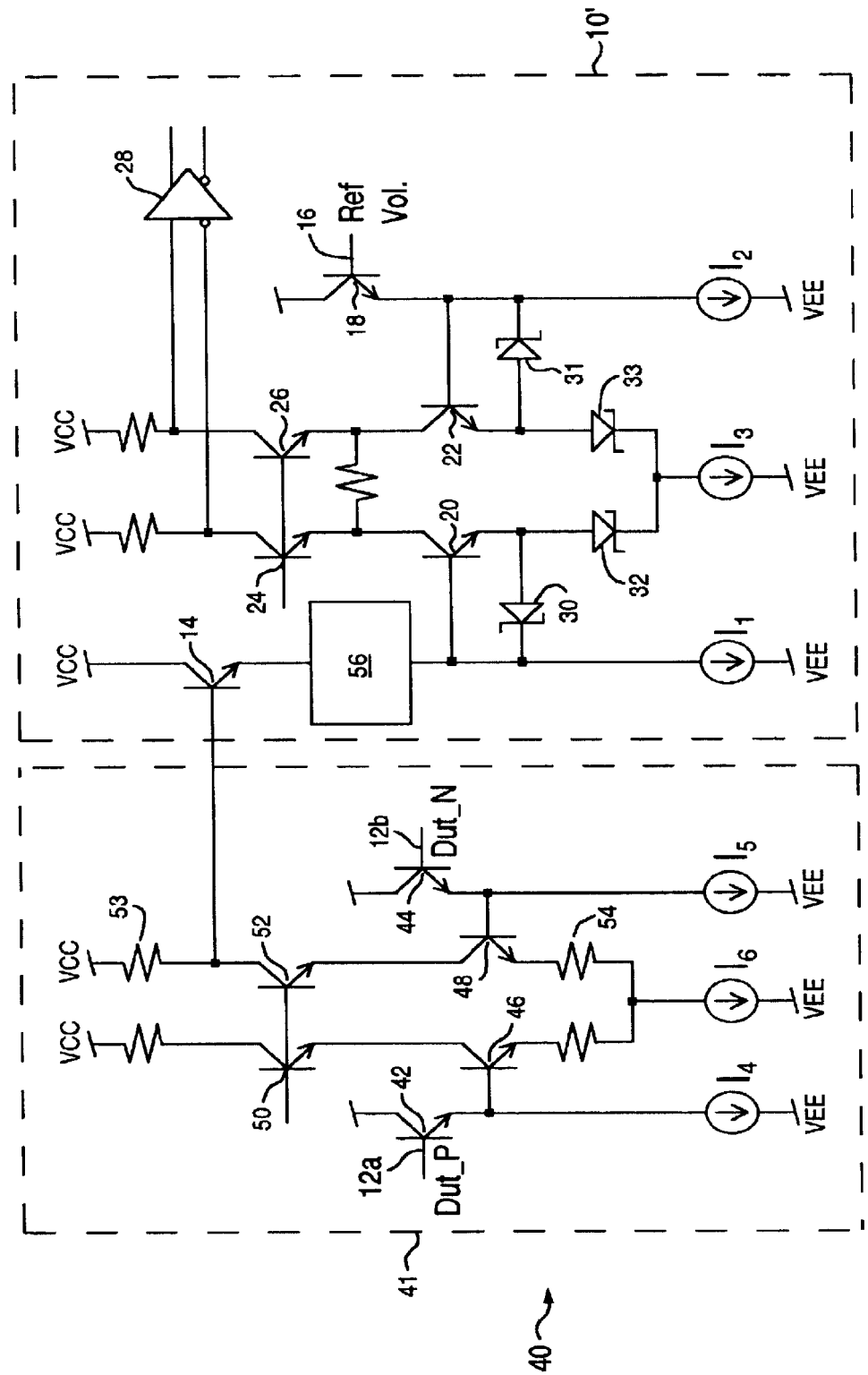
FIG. 4 shows a schematic diagram of a conventional differential comparator circuit.

Switch stage 155 combines the signals on the output terminals 152a, 152b and 154a, 154b in a desired manner and produces the combined signals on output terminals 155a and 155b. For example, in one embodiment, output terminal 155a has the combined currents of DUT_P with either DUT_N or Ref_N and output terminal 155b has the combined currents of Ref_P with either DUT_N or Ref_N. The two outputs terminals 155a and 155b of switch stage 155 are coupled to a conventional comparator stage 170, which is similar to comparator circuit 10 of FIG. 2. Comparator stage 170 can thus compare the combined currents on output terminals 155a and 155b.

In operation, the differential swing comparison mode is obtained by taking the difference between the two reference voltages (Ref_P−Ref_N) and comparing that to the swing of the DUT inputs (DUT_P−DUT_N). To do this, switch circuit 155 combines DUT_P with Ref_N and produces the combined current on terminal 155a. Switch circuit 155 also combined DUT_N with Ref_P and produces the combined current on terminal 155b. The two combined signals are compared by comparison circuit 170.

$$(DUT\_P+Ref\_N)=(DUT\_P+Ref\_N), \quad \text{eq. 2}$$

which is equivalent to:

$$(DUT\_P-DUT\_N)=(Ref\_P-Ref\_N), \quad \text{eq. 3}$$

In the common-mode voltage comparison mode, the sum of the two reference voltages (Ref_P+Ref_N) is compared with the sum of the DUT inputs (DUT_P+DUT_N). Thus, switch circuit 155 combines DUT_P with DUT_N and produces the combined current on terminal 155a and combines Ref_P with Ref_N and produces the combined current on terminal 155b. The two combined signals are compared by comparison circuit 170.

$$(DUT\_P+DUT\_N)=(Ref\_P+Ref\_N), \quad \text{eq. 4}$$

which is equivalent to:

$$(DUT\_P+DUT\_N)/2=(Ref\_P+Ref\_N)/2, \quad \text{eq. 5}$$

In one embodiment, the output signals from one of the transconductance stage 152 or 154 can be switchably eliminated. Thus, the DUT input can be compared to the corresponding reference voltage. For example, the output signals from transconductance stage 154 are eliminated and switch circuit 155 produces DUT_P on terminal 155a and Ref_P on terminal 155b. Alternatively, the output signals from transconductance stage 152 can be eliminated and switch circuit 155 can produce DUT_N on terminal 155a and Ref_N on terminal 155b. The comparator circuit 170 may then make the P channel or N channel comparison.

It should be understood that if desired, the transconductance stages 152 and 154 can be combined into a single transconductance stage with four input terminals and four output terminals.

Figure 5B:
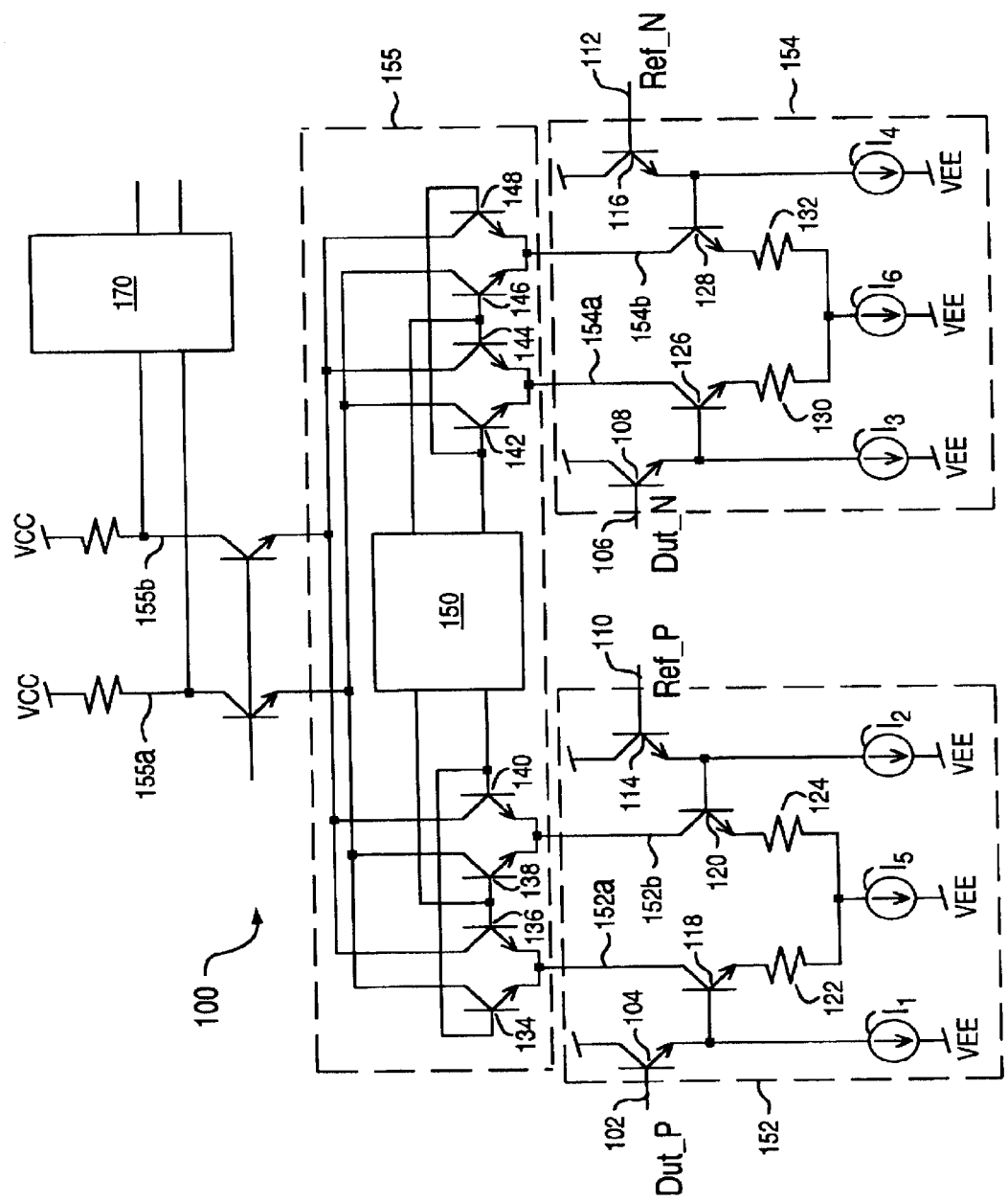
FIG. 5B shows a schematic diagram of a comparator circuit having differential swing comparison mode and common-mode voltage comparison mode in accordance with an embodiment of the present invention.

FIG. 5B shows a schematic diagram showing one exemplary implementation of comparator circuit 100. As shown in FIG. 5B, transconductance stage 152 includes transistors 118 and 120 that are coupled to current source 15 through resistors 122 and 124, respectively. Transistors 104 and 114 receive the test voltage DUT_P and the reference voltage Ref_P, respectively. Transistors 104 and 114 are coupled to transistors 118 and 120 and serve as emitter follower stages. The collectors of transistors 118 and 120 serve as the output terminals of transconductance stage 152.

Transconductance stage 154 is identical to stage 152, except that the test voltage DUT_N and reference voltage Ref_P are received. The collectors of transistors 126 and 128 in transconductance stage 154 serve as the output terminals 154a and 154b. The emitter resistance in stages 152 and 154, i.e., resistors 122, 124, 130 and 132 are chosen so that the maximum emitter degeneration voltage is enough for the maximum input swing.

Switch stage 155, as shown in FIG. 5B, is formed by a number of transistors. Each output terminal from a transconductance stage 152, 154 is coupled to the output terminals 155a and 155b of switch stage 155 through a transistor. Thus, for example, the output terminal 152a is coupled to terminal 155a through transistor 134 and to terminal 155b through transistor 136. The output terminal 152b is coupled to terminals 155a and 155b through transistors 138 and 140, respectively. The bases of transistors 134 and 140 are coupled together and the bases of transistors 136 and 138 are coupled together.

Similarly, the output terminal 154a is coupled to terminals 155a and 155b through transistors 142 and 144, respectively, while the output terminal 154b is coupled to terminals 155a and 155b through transistors 146 and 148, respectively. The bases of transistors 142 and 148 are coupled together and the bases of transistors 144 and 146 are coupled together.

Switch circuit 155 also includes a select circuit 150 that is coupled to the transistor pairs 134/140, 136/138, 142/148, and 144/146. In operation, select circuit 150 turns on one transistor pair and turns off the other transistor pair that are coupled to each transconductance stage 152 and 154. For example, when transistor pair 134/140 are turned on, transistor pair 136/138 are turned off. In addition, selecting circuit 150 is controlled to select the desired mode of operation, i.e., differential comparison mode or common-mode voltage comparison mode. Select circuit 150 may be a conventional circuit used to turn on and off desired transistors.

As discussed above, the differential comparison mode is selected by combining DUT_P with Ref_N and combining DUT_N with Ref_P. Thus, for example, select circuit 150 can turn on transistor pairs 134/140 and transistor pair 144/146. Alternatively, select circuit 150 can turn on transistor pairs 136/138 and transistor pair 142/148. Thus, in differential swing comparison mode, the collector currents of transistor 118 and transistor 128 are merged and the collector currents of transistor 120 and transistor 126 are merged. The combined signals are received by comparator circuit 170 via terminals 155a and 155b. The output signals of comparator circuit 170 toggles when the sum of collector currents from transistor 118 and transistor 128 is equal to the sum of collector currents from transistor 120 and transistor 126. Because the two transconductance stages 152 and 154 are identical, this condition is met when equation 3 is satisfied. Thus, the differential swing comparison mode is realized.

As discussed above, the common-mode voltage comparison mode is selected by combining the two reference voltages (Ref_P+Ref_N) and the two DUT inputs (DUT_P+DUT_N). Thus, for example, select circuit 150 can turn on transistor pairs 134/140 and transistor pair 142/148. Alternatively, select circuit 150 can turn on transistor pairs 136/138 and transistor pair 144/146. Thus, in common-mode voltage comparison mode, the collector currents of transistor 118 and transistor 126 are merged and the collector currents of transistor 120 and transistor 128 are merged. The output signals of comparator circuit 170 toggles when the sum of collector currents from transistor 118 and transistor 126 is equal to sum of collector currents from transistor 120 and transistor 128. Because the two transconductance stages 152 and 154 are identical, this condition is met when equation 5 is satisfied. Thus, the common-mode comparison mode is realized.

While each transconductance stage 152 and 154 may have non-linearity as the input swing changes, the non-linearity from the two transconductance stages 152 and 154 advantageously cancels out. The non-linearity cancels out because the two transconductance stages 152 and 154 have the same input swing when (DUT_P−DUT_N) is equal to (Ref_P−Ref_N) in the differential comparison mode (equation 3) or when ((DUT_P+DUT_N)/2) is equal to ((Ref_P+Ref_N)/2) in the common-mode comparison mode (equation 5). Thus, comparator accuracy is not degraded by the non-linearity of transconductance stages 152 and 154 caused by the input swing change.

Furthermore, comparator circuit 100 of FIG. 5 sums the currents of the transconductance amplifiers directly instead of first converting them to voltages. Thus, comparator circuit 100, advantageously, has no need for level shifting. This results in comparator circuit 100 having excellent high-speed performance relative to conventional comparator circuits, e.g., high input bandwidth, high data rate, small timing error, and small detectable pulse width.

Figure 6:
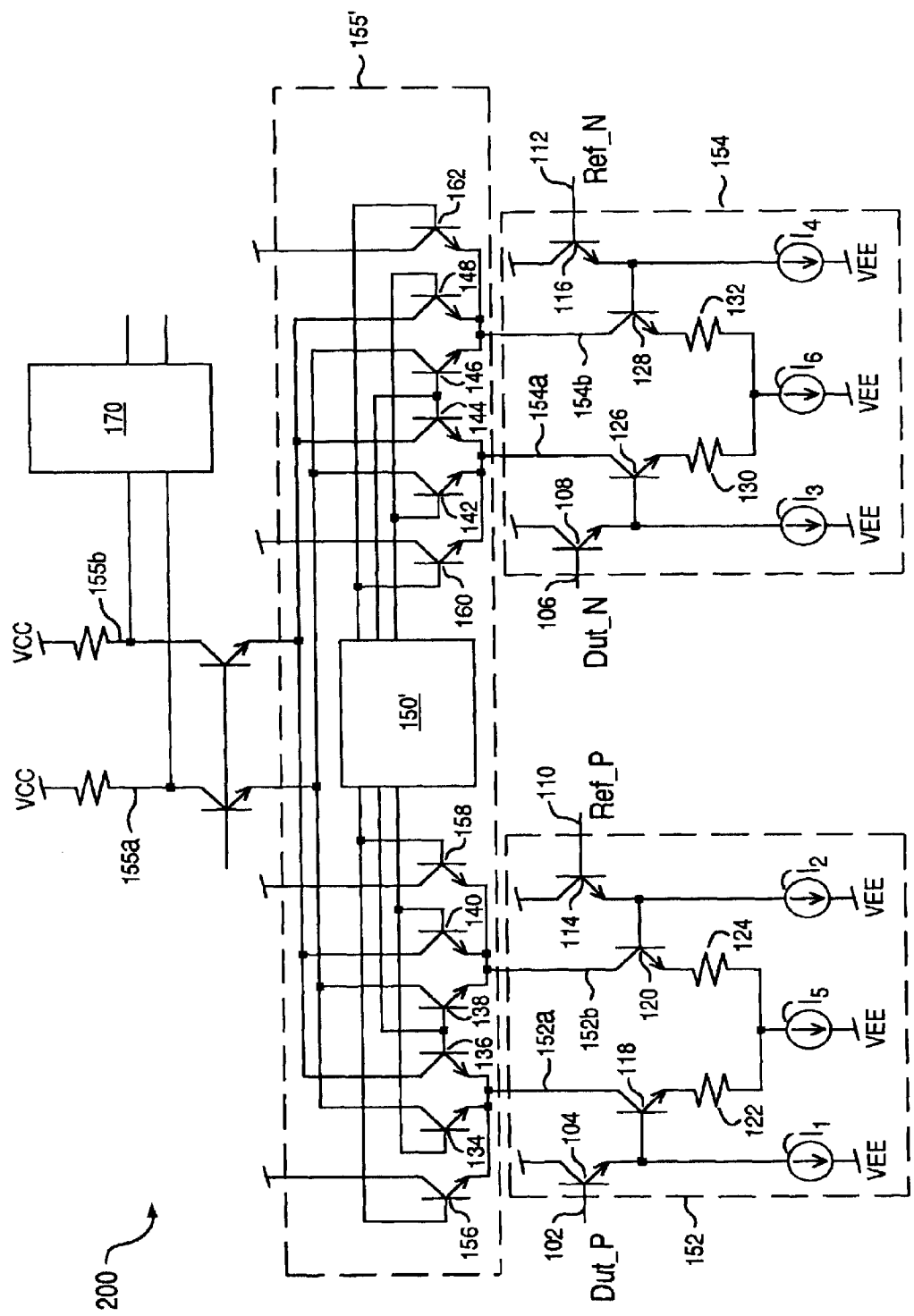
FIG. 6 shows a schematic diagram of a comparator circuit having single-ended comparison mode, differential swing comparison mode, and common-mode voltage comparison mode in accordance with another embodiment of the present invention.

FIG. 6 shows a schematic diagram of a comparator circuit 200 having single-ended comparison mode, differential swing comparison mode, and common-mode voltage comparison mode in accordance with another embodiment of the present invention. Thus, comparator circuit 200 can perform all eight comparison modes shown in FIGS. 3A–3D. Comparator circuit 200 is similar to comparator circuit 100, shown in FIG. 5B, like designated elements being the same. However, comparator circuit 200 includes additional transistors 156, 158, 160, 162 in switch circuit 155'. The bases of transistors 156 and 158 are coupled together and are controlled by select circuit 150'. Similarly, the base of transistors 160 and 162 are coupled together and are controlled by select circuit 150'. Transistors 156, 158, 160, 162 couple respective output terminals 152a, 152b, 154a, 154b to a voltage source.

Thus, when selected, transistors 156 and 158 prevent the collector currents from transistors 118 and 120 from flowing through terminals 155a and 155b. Consequently, transconductance stage 152 is eliminated and the test current DUT_N and the reference current Ref_N can be placed on terminals 155a and 155b, e.g., by turning on transistor pair 142/148 or 144/146. Thus, comparator circuit 170 compares DUT_N with Ref_N. Alternatively, when transistors 260 and 162 are selected, the collector currents from transistors 126 and 128 are prevented from flowing through terminals 155a and 155b. Consequently, transconductance stage 154 is eliminated and the test current DUT_P and the reference current Ref_P can be placed on terminals 155a and 155b, e.g., by turning on transistor pair 134/1140 or 136/138. Thus, comparator circuit 170 compares DUT_P with Ref_P. Selecting circuit 150' is inhibited from selecting transistor pairs 156/158 and 160/162 at the same time.

Because all eight comparison modes can be realized by a single comparator circuit 200, the size of the pin electronics can advantageously be cut down with the configuration of the present invention. In addition, all eight comparison modes have almost identical propagation delays because the signal paths are the same. Thus, when using comparator circuit 200 according to an embodiment of the present invention and as shown in FIG. 6, it is not necessary to apply timing calibration to all comparator modes.

It should be understood that the reference voltages Ref_P and Ref_N are programmable. Thus, different devices having different specifications may be tested using the same comparator circuit. For example, one device under test may require a minimum swing specification of 400 mV while another device under test may require a minimum swing specification of 1V. Thus, because Ref_P and Ref_N are programmable, Ref_P−Ref_N can be set at 400 mV or 1V (or any other desired value) to accommodate the different devices under test. Moreover, the reference voltages Ref_P and Ref_N may be changed for the same device under test depending on the mode of operation. Thus, for example, a device may require a high voltage of 0.8V, i.e., VOH_P=0.8V in FIG. 3A, a low voltage of 0.2V, i.e., VOL_N=0.2V in FIG. 3B, and a minimum swing of 1V, i.e., VOH_D=1V in FIG. 3C(i). Thus, when testing high and low voltages of the device, the reference voltage Ref_P is set to 0.8V and reference voltage Ref_N is seet to 0.2V, in differential mode, Re_P−Ref_N is set to 1V.

It should be understood, that the present invention may be realized using voltages rather than currents. Thus, for example, in FIG. 5A, stages 152 and 154 are differential amplifiers. Thus, nodes 152a and 152b have a voltage signals proportional to DUT_P and Ref_P, and nodes 154a and 154b have voltages signals proportional to DUT_N and Ref_N. Switch 155 would include four comparator circuits, that compare node 152a with 154a, 152a with 154b, 152b with 154a, and 152b with 154b. Each of node 155a and 155b then has a voltage signal that is based on one of the four comparator circuits. Of course, the circuit may include a single-ended comparison mode, in which case the node 155a and 155b, receive the voltage signals from nodes 152a and 152b or from nodes 154a and 154b.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. An apparatus comprising:
   at least one stage having a first input terminal that receives a first test voltage, a second input terminal that receives a first reference voltage, a third input terminal that receives a second test voltage, and a fourth input terminal that receives a second reference voltage, said at least one stage having a first output terminal upon which is produced a first test signal that is proportional to said first test voltage, a second output terminal upon which is produced a first reference signal that is proportional to said first reference voltage, a third output terminal upon which is produced a second test signal that is proportional to said second test voltage, and a fourth output terminal upon which is produced a second reference signal that is proportional to said second reference voltage;

a switching circuit coupled to said at least one stage, said switching circuit having a first output terminal that is switchably coupled to said first output terminal and one of said third output terminal and said fourth output terminal of said at least one stage, said switching circuit having a second output terminal that is switchably coupled to said first output terminal and one of said third output terminal and said fourth output terminal of said at least one stage; and a comparator circuit having a first input terminal coupled to said first output terminal of said switching circuit and a second input terminal coupled to said second output terminal of said switching circuit.

2. The apparatus of claim 1, wherein said at least one stage is at least one transconductance stage, and wherein said first test signal is a first test current and said second test signal is a second test current, and wherein said first reference signal is a first reference current and said second reference signal is a second reference current.

3. The apparatus of claim 1, wherein said at least one stage is a differential amplifier and wherein said first test signal, said second test signal, said first reference signal, and said second reference signal are voltage signals.

4. The apparatus of claim 2, wherein said at least one transconductance stage comprises:

a first transconductance stage having said first input terminal, said second input terminal, said first output terminal and said second output terminal; and a second transconductance stage having said third input terminal, said fourth input terminal, said third output terminal and said fourth output terminal.

5. The apparatus of claim 2, wherein said switching circuit comprises:

a first transistor coupled between said third output terminal of said at least one transconductance circuit and said first output terminal of said switching circuit;

a second transistor coupled between said third output terminal of said at least one transconductance circuit and said second output terminal of said switching circuit;

a third transistor coupled between said fourth output terminal of said at least one transconductance circuit and said first output terminal of said switching circuit; and a fourth transistor coupled between said third output terminal of said at least one transconductance circuit and said second output terminal of said switching circuit;

wherein the bases of said first transistor and said fourth transistor are coupled together and the bases of said second transistor and said third transistor are coupled together.

6. The apparatus of claim 5, wherein said switching circuit further comprises:

a fifth transistor coupled between said first output terminal of said at least one transconductance circuit and said first output terminal of said switching circuit;

a sixth transistor coupled between said first output terminal of said at least one transconductance circuit and said second output terminal of said switching circuit;

a seventh transistor coupled between said second output terminal of said at least one transconductance circuit and said first output terminal of said switching circuit; and an eighth transistor coupled between said second output terminal of said at least one transconductance circuit and said second output terminal of said switching circuit;

wherein the bases of said fifth transistor and said eighth transistor are coupled together and the bases of said sixth transistor and said seventh transistor are coupled together.

7. The apparatus of claim 6, further comprising a select circuit having a first terminal coupled to said bases of said first transistor and said fourth transistor, a second terminal coupled to said bases of said second transistor and said third transistor, a third terminal coupled to said bases of said fifth transistor and said eighth transistor, and a fourth terminal coupled to said bases of said sixth transistor and said seventh transistor, wherein said select signal produces complementary signal on said first terminal and said second terminal and produces complementary signals on said third terminal and said fourth terminal.

8. The apparatus of claim 6, wherein said switching stage further comprises:

a ninth transistor coupled between said first output terminal of said at least one transconductance circuit and a voltage source;

a tenth transistor coupled between said second output terminal of said at least one transconductance circuit and a voltage source;

an eleventh transistor coupled between said third output terminal of said at least one transconductance circuit and a voltage source; and a twelfth transistor coupled between said fourth output terminal of said at least one transconductance circuit and a voltage source.

9. The apparatus of claim 1, wherein said first reference voltage and said second reference voltage are programmable voltages.

10. A method of testing a circuit, the method comprising:

providing a first test voltage from a first channel from said circuit and a second test voltage from a second channel from said circuit;

providing a first reference voltage and a second reference voltage;

converting said first test voltage to a first test signal and said second test voltage to a second test signal;

converting said first reference voltage to a first reference signal and said second reference voltage to a second reference signal;

switchably combining said first test signal with one of said second reference signal and said second test signal to form a first combined signal;

switchably combining said first reference signal with one of said second test signal and said second reference signal to form a second combined signal; and comparing said first combined signal with said second combined signal.

11. The method of claim 10, wherein said first test signal is a first test current and said second test signal is a second test current and wherein said first reference signal is a first reference current and said second reference signal is a second reference current.

12. The method of claim 10, wherein said first test signal, said second test signal, said first reference signal, and said second reference signal are voltage signals.

13. The method according to claim 11, wherein said first combined current is formed by combining said first test current with said second reference current and said second combined current is formed by combining said first reference current with said second test current to realize a differential swing comparison mode.

14. The method according to claim 11, wherein said first combined current is formed by combining said first test current with said second test current and said second combined current is formed by combining said first reference current with said second reference current to realize a common-mode comparison mode.

15. The method according to claim 11, further comprising disabling the contribution of said second test current and said second reference current wherein said first combined current comprises said first test current and said second combined current comprises said first reference current to realize a P-channel comparison mode.

16. The method according to claim 11, further comprising disabling the contribution of said first test current and said first reference current wherein said first combined current comprises one of said second test current and said second reference current and said second current comprises one of said second test current and said second reference current to realize an N-channel comparison mode.

17. A method of testing a circuit, the method comprising:
providing a first test voltage from a first channel from said circuit and a second test voltage from a second channel from said circuit;
providing a first reference voltage and a second reference voltage;
converting said first test voltage to a first test current and said second test voltage to a second test current;
converting said first reference voltage to a first reference current and said second reference voltage to a second reference current;
switchably combining said first test current with one of said second reference current and said second test current to form a first combined current;
switchably combining said first reference current with one of said second test current and said second reference current to form a second combined current; and
comparing said first combined current with said second combined current.

* * * * *